United States Patent

Hawkins et al.

[11] Patent Number: 5,889,277
[45] Date of Patent: Mar. 30, 1999

[54] PLANAR COLOR FILTER ARRAY FOR CCDS WITH EMBEDDED COLOR FILTER ELEMENTS

[75] Inventors: Gilbert Allan Hawkins, Mendon; David Lawrence Losee, Fairport; Robert Leroy Nielsen, Pittsford; Ronald W. Wake, Hilton, all of N.Y.

[73] Assignee: Eastman Kodak Company, Rochester, N.Y.

[21] Appl. No.: 762,470

[22] Filed: Dec. 9, 1996

Related U.S. Application Data

[62] Division of Ser. No. 561,504, Nov. 20, 1995, Pat. No. 5,677,202.

[51] Int. Cl.$^6$ ............................. H01L 27/146; G01J 3/51
[52] U.S. Cl. ...................... 250/208.1; 250/226; 257/294; 257/432
[58] Field of Search ................... 250/208.1, 226; 257/222, 294, 432; 438/27, 60, 65, 69, 70, 71

[56] References Cited

U.S. PATENT DOCUMENTS

| | | | |
|---|---|---|---|
| 4,029,394 | 6/1977 | Araki | 257/440 |
| 4,081,277 | 3/1978 | Brault et al. | 96/38 |
| 4,204,866 | 5/1980 | Horak et al. | 430/306 |
| 4,247,799 | 1/1981 | Drexhage | 313/367 |
| 4,271,246 | 6/1981 | Sato et al. | 430/7 |
| 4,307,165 | 12/1981 | Blazey et al. | 430/8 |
| 4,315,978 | 2/1982 | Hartman | 430/4 |
| 4,383,017 | 5/1983 | Hirofumi et al. | 430/7 |
| 4,387,146 | 6/1983 | Whitmore | 430/7 |
| 4,395,629 | 7/1983 | Susano et al. | 250/226 |
| 4,553,153 | 11/1985 | McColgin et al. | 357/30 |
| 4,565,756 | 1/1986 | Needs et al. | 430/7 |
| 4,764,670 | 8/1988 | Pace et al. | 250/226 |
| 4,876,167 | 10/1989 | Snow et al. | 430/7 |
| 5,053,298 | 10/1991 | Park et al. | 430/7 |
| 5,132,251 | 7/1992 | Kim et al. | 437/225 |
| 5,321,249 | 6/1994 | Nomura | 250/208 |
| 5,340,619 | 8/1994 | Chen et al. | 424/498 |
| 5,404,005 | 4/1995 | Shimomura et al. | 250/208.1 |
| 5,439,582 | 8/1995 | Oka et al. | 205/135 |
| 5,464,714 | 11/1995 | Watanabe et al. | 430/7 |
| 5,479,049 | 12/1995 | Aoki et al. | 287/642 |
| 5,677,202 | 10/1997 | Hawkins et al. | 438/70 |
| 5,708,264 | 1/1998 | Hawkins et al. | 250/226 |
| 5,719,074 | 2/1998 | Hawkins et al. | 438/70 |

FOREIGN PATENT DOCUMENTS

| | | |
|---|---|---|
| 3184022 | 8/1991 | Japan . |
| 4258902 | 9/1992 | Japan . |

*Primary Examiner*—Edward P. Westin
*Assistant Examiner*—John R. Lee
*Attorney, Agent, or Firm*—Raymond L. Owens

[57] ABSTRACT

An image sensor and method of making such sensor is described. The sensor includes an integral color filter array, comprising: a semiconductor substrate having an optically planar top surface; a plurality of spaced image pixels formed in the substrate; and an array of physically contiguous color filter elements embedded in the substrate whose top and bottom surfaces are coplanar and which have no overlap of color filter layers between adjacent color filter elements.

2 Claims, 8 Drawing Sheets

PLANAR COLOR FILTER ARRAY FOR CCDS WITH EMBEDDED COLOR FILTER ELEMENTS

This is a Divisional of application Ser. No. 08/561,504, filed Nov. 20, 1995 now U.S. Pat No. 5,677,202.

CROSS REFERENCE TO RELATED APPLICATION

Reference is made to commonly assigned U.S. Ser. No. 08/554,884 filed Nov. 7, 1995, now U.S. Pat. No. 5,708,264 entitled "Planar Color Filter Array for CCDs From Dyed and Mordant Layers" by Hawkins et al, the teachings of which are incorporated herein by reference.

FIELD OF THE INVENTION

This invention relates to solid state color image sensor which includes a plurality of color filter elements embedded in a semiconductor substrate in an array having planar upper and lower surfaces.

BACKGROUND OF THE INVENTION

A solid state imager can be viewed as including a number of laterally offset pixels containing photosensitive regions. Arrays of color filter elements transmitting selected portions of the visible spectrum and placed in registration with the pixels of a solid state imager are well known to the art and can take a variety of forms. Each color filter element transmits a portion of the color spectrum of incident light into the associated pixel of the imager in order to provide the imager with means of color sensitization. All visible image sensors, including linear sensors, can utilize color filters whether or not the photosensitive region occupies the entire pixel area. Typically, the color filter elements are transmissive of a set of primary colors such as red, green and blue or of complementary colors such as cyan, yellow, and magenta and or white. Lens arrays integral to the image sensor, commonly made by thermal deformation of photolithographically defined polymers, are often employed over color filter arrays to direct light rays through color filter elements to the photosensitive regions.

FIG. 1 shows a single pixel 10 of a typical interline image sensor in registration with color filter elements 24a and 24b partially including a color filter array, lens 22, photodiode 14 formed in semiconductor substrate 12, gate electrode 16, and light shield 18. The gate electrode and light shield are typically isolated electrically from one another and from the substrate by isolation oxides not shown. A color filter array includes a plurality of color filter elements 24a, 24b, and 24c (not shown), typically provided in a pattern of three or more elements each transmitting a different spectral region. Photodiode 14, semiconductor substrate 12, gate electrode 16, and light shield 18 form semiconductor portion 40 of the imager.

The prior art image sensor with a pixel shown in FIG. 1 has a partially planarizing layer 20a for offsetting the color filter element 24a from photodiodes 14. Conventionally, the partially planarizing layer includes an organic spacer layer spin coated to achieve some degree of planarization in order to provide simpler processing conditions for deposition of the color filter array, such as the color filter arrays described in Nomura, U.S. Pat. No. 5,321,249, typically coated from organic materials. Partially planarizing layer 20a enables better process control of the thickness of the color filter elements, essential in controlling the spectral transmission characteristics. The use and limitations of such planarizing layers in optically active solid state image sensors is taught by McColgin, U.S. Pat. No. 4,553,153 for a polymerizable monomer. Upper planarizing layer 20b in FIG. 1 is typically used to space lens 22 away from photodiode 14 and partially compensates for irregular topography of conventional color filter elements.

As shown in FIG. 1, prior art color filter arrays suffer to some degree from lack of planarity, due to both lack of planarity of the substrate on which they are formed (region 60 of FIG. 1 and of FIGS. 2A and 2B) and lack of planarity of the color filter elements relative to one another (region 62 of FIG. 1 and of FIGS. 2A and 2B). Lack of planarity of the substrate produces variations in the thickness of the color filter elements coated on the substrates, which in turn causes local differences in the optical transmission characteristics within each element. Lack of planarity between color filter elements (region 62 of FIG. 1 and of FIGS. 2A and 2B) also results in inter-pixel nonuniformities and in addition causes unwanted light piping and color mixing in regions where a subsequently defined color filter element overlaps a previously defined color filter element. Hartman, U.S. Pat. No. 4,315,978, teaches a method of making color filter arrays in which color filter elements are formed by creating dyeable islands separated by dye impermeable polymers. Neighboring color filter elements, however, overlap to some degree, altering spectral transmission characteristics of color filter elements, and the process typically relies on mask to mask alignment accuracy, thereby reducing process latitude. Spectral characteristics are similarly difficult to control, particularly if the pixel size is small, because the area of misalignment must be reduced with pixel size to maintain adequate color resolution. In addition, the overlapping regions make subsequent coatings difficult to coat smoothly.

Various approaches have been undertaken to improve the planarity of the color filter arrays and the substrates on which they are formed, but none has been fully satisfactory. Nomura, U.S. Pat. No. 5,321,249, relies on spin-on color filter materials which are to some extent self-planarizing. When the materials for the second or the third color filter elements are coated, this technique greatly reduces the thickness of the spun-on material left over the previously deposited color filter elements (region 62 of FIG. 2B) because the previously deposited elements are topographically high, as is well known in the art of spin-on planarization. However, not all the material is removed. Horak, U.S. Pat. No. 4,204,866, teaches a method of making color filter elements in which a single mordant layer is dyed through openings in the photoresist, the process being repeated using dyes of different colors to provide side-by-side color filter elements. However, the color filter elements are not self aligned, so that the process is sensitive to mask to mask misalignment tolerances. Also, the mordant swells when dyed, as is well known in the art, so that the surface of the single mordant layer becomes non-planar. Also the lateral diffusion of the dyes is too large for very small pixels, being at least the thickness of the mordant layer, typically several microns.

Brault, U.S. Pat. No. 4,081,277 teaches repeated thermal dye transfer into a receiving layer using a photoresist mask, but this method also suffers from poor lateral definition of the dye and has not found use in small pixels. Drexhage, U.S. Pat. No. 4,247,799, discloses a single dyed polymer layer that is photobleachable, so that in principal regions of different colors can be formed by optical exposure at different wavelengths, but the edges of the color filter elements are not abruptly defined by this process due to light scatter and beam focus at the scale of a few tenths of a micron. This method has not found acceptance due to the need for special exposure equipment and to the difficulty of finding dyes which are both photobleachable and whose spectral properties are optimal for imagers. Pace and Blood, U.S. Pat. No. 4,764,670, discuss a two layer subtractive color system which provides precise control of density and hue and reduce the number of colors needed in each layer. Although their schematic illustrations indicate perfect registration of the color filter elements, no method is provided for achieving perfect registration, there being still a need for photolithographic alignment to define the lateral extent of the first and the second dyed layer and their overlap, nor is mordant swelling prevented. While this technique is advantageous for large pixel sizes, lack of planarity is disadvantageous for small image sensors, for example for pixels less than 10 microns in size. Snow et al, U.S. Pat. No. 4,876,167, describes a variety of photo-crosslinkable mordants to enable deposition of dyes in specific regions of a mordant which have been exposed optically, but these materials also suffer from lack of adequate spatial resolution, residual dye instability, and from swelling of the mordant. Blazey, U.S. Pat. No. 4,307,165, and Whitmore, U.S. Pat. No. 4,387,146 disclose the confinement of dyes in cells, but the means of fabrication using organic cell structures with thick cell walls formed photolithographically or by embossing has not proven advantageous for small pixel imagers due to the gap between dyed regions, and to the fact that thin walls are prone to distortion when they are not supported by material between them, as is the case for the cells described U.S. Pat. No. 4,387,146 and U.S. Pat. No. 4,307,165. This is particularly true for semiconductor process environments due to the use of fluid baths whose surface tension can distort unsupported thin walls, as is well known in the art.

SUMMARY OF THE INVENTION

It is an object of this invention to provide a color filter array for a solid state imager which reduces or eliminates the problems cited above by permitting all color filter elements of the array to have entirely coplanar top and bottom surfaces with no overlap and with minimal gaps or no gaps between adjacent elements.

It is another object of this invention to provide a method of making such an array which is substantially independent of the materials from which the array is formed.

These objects are achieved in an image sensor which includes an integral color filter array, comprising:
  (a) a semiconductor substrate having an optically planar top surface;
  (b) a plurality of spaced image pixels formed in the substrate; and
  (c) an array of physically contiguous color filter elements embedded in the substrate whose top and bottom surfaces are coplanar and which have no overlap of color filter layers between adjacent color filter elements.

These objects are further achieved in a method of making an integral color filter array in a solid state imager, comprising the steps of:
  (a) providing a semiconductor substrate having an optically planar top surface;
  (b) providing a plurality of spaced imager pixels formed in the substrate;
  (c) embedding a first set of dyed color filter elements in the planar top surface;
  (d) providing openings in the top surface adjacent to the first set of dyed color filer elements,
  (e) uniformly coating a dyed second color filter layer at least in the openings between the first set of dyed color filter elements; and
  (f) removing entirely the dyed color filter layer from the first set of color filter elements to form a second set of color filter elements.

ADVANTAGES

An advantage of image sensors made in accordance with this invention is that the gap between color filter elements is minimal or vanishes entirely. It is also advantageous that there can be no overlap between color filter elements.

Another advantage is that the color filter elements may be self aligned to one another so that mask to mask misalignments do not degrade performance or yield.

A still further advantage is that the surface upon which the color filter array is disposed is rendered optically planar so that light rays are refracted only as expected from an ideal dielectric interface.

Another advantage is that substantially identical processes may be used to make arrays from a variety of layers.

A feature of image sensors made in accordance with this invention is that the top surface of the color filter array can be entirely planar.

DETAILED DESCRIPTION OF THE PREFERRED EMBODIMENTS

Figure 1:
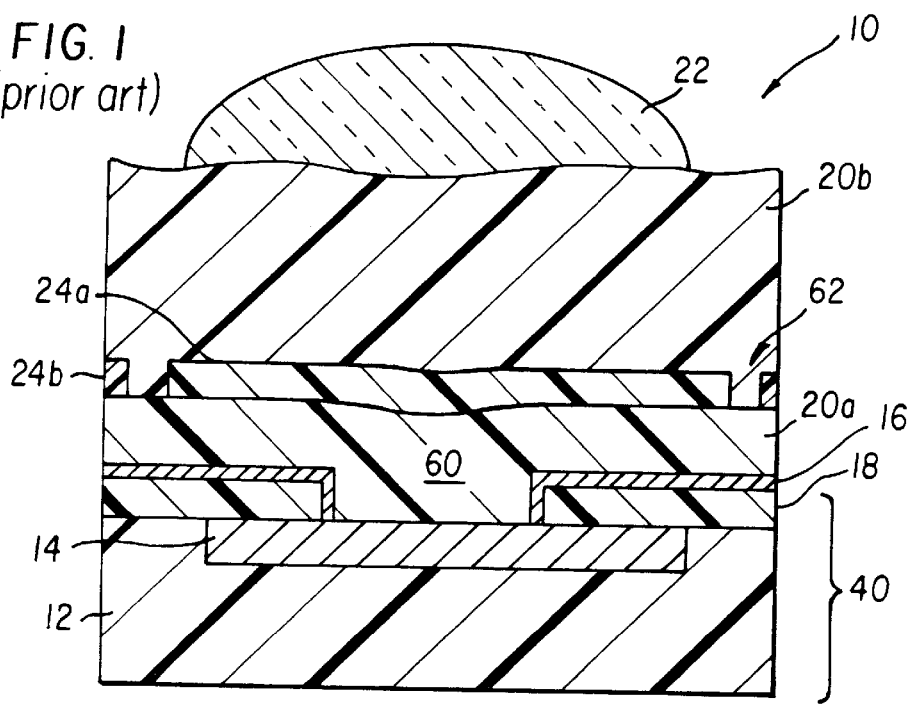
FIG. 1 depicts a partially schematic cross-sectional view of a prior art image sensor.
Figure 2A:
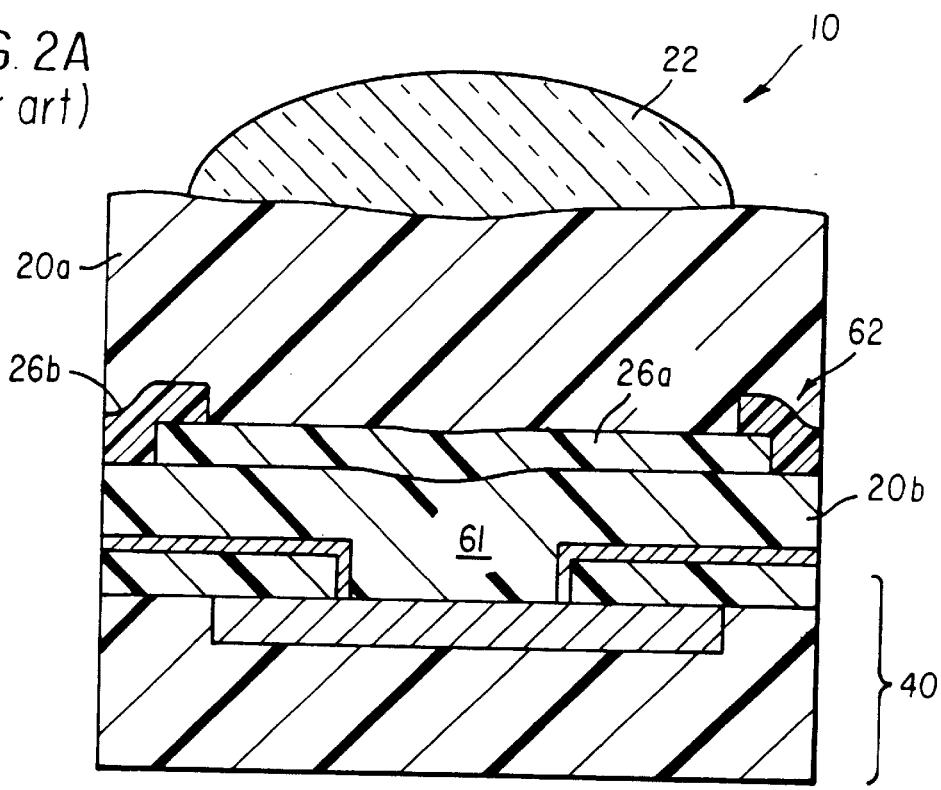
FIGS. 2A–2B depict partially schematic cross-sectional view of prior art image sensor.
Figure 2B:
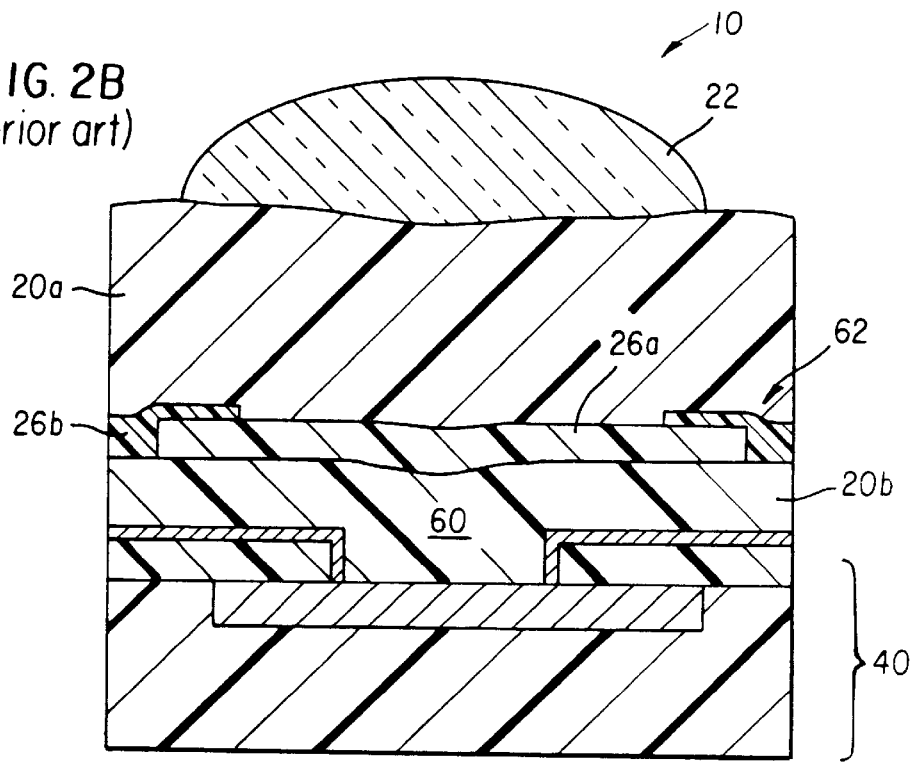
Figure 3A:
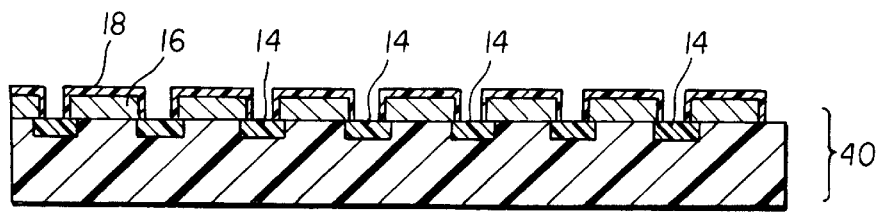
FIGS. 3A–3O show cross-sectional views of various stages of making imager pixels in accordance with this invention.
Figure 3B:
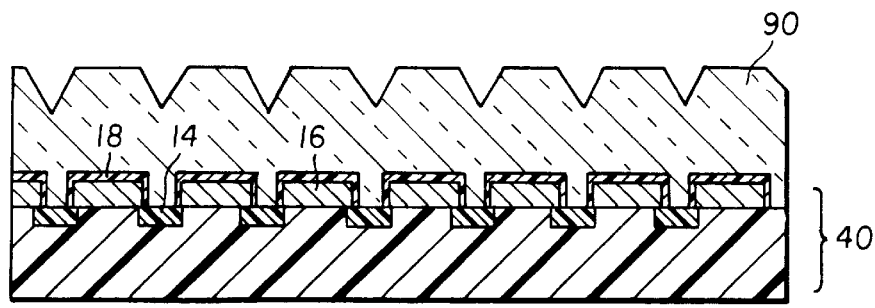
Figure 3C:
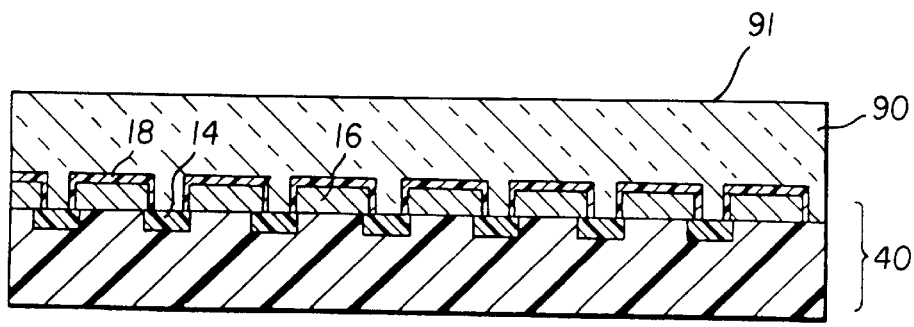
Figure 3D:
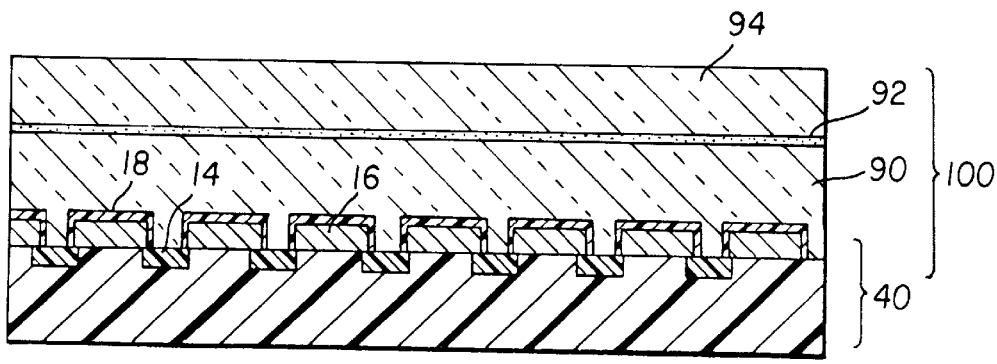
Figure 3E:
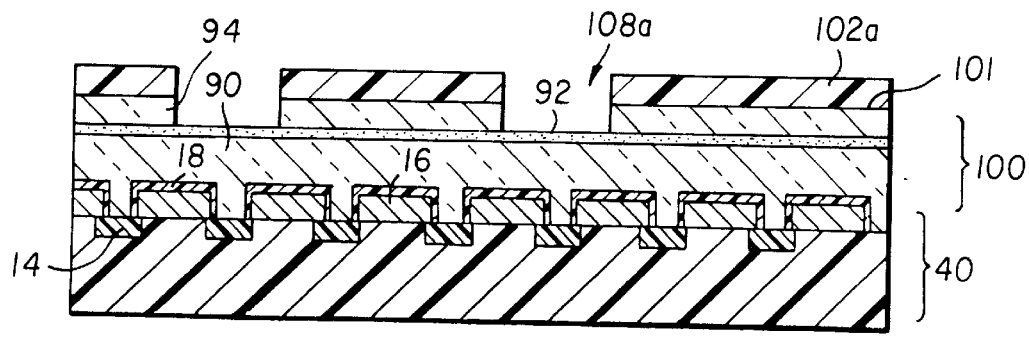
Figure 3F:
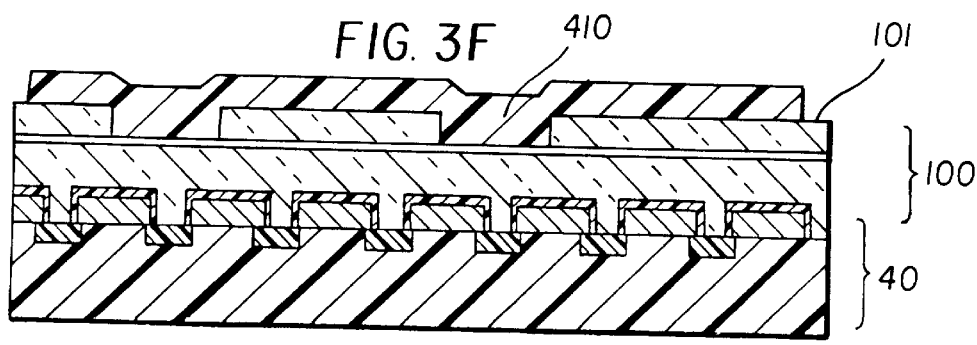
Figure 3G:
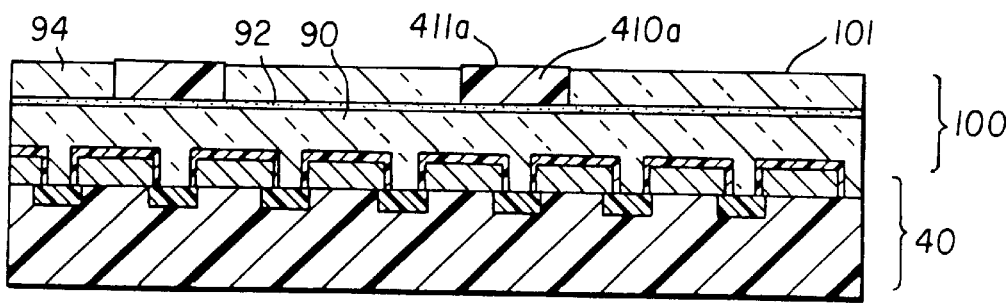
Figure 3H:
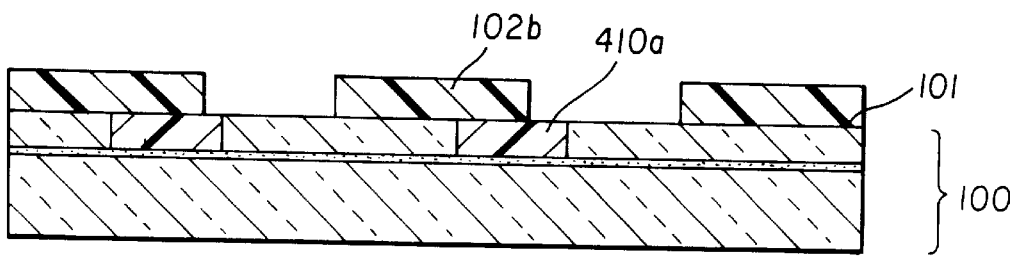
Figure 3I:
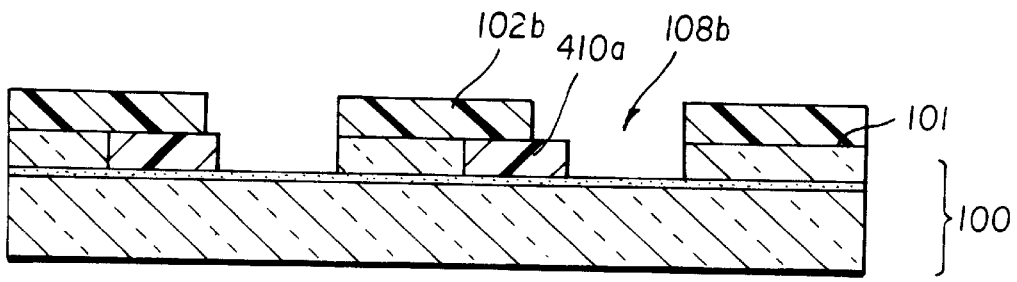
Figure 3J:
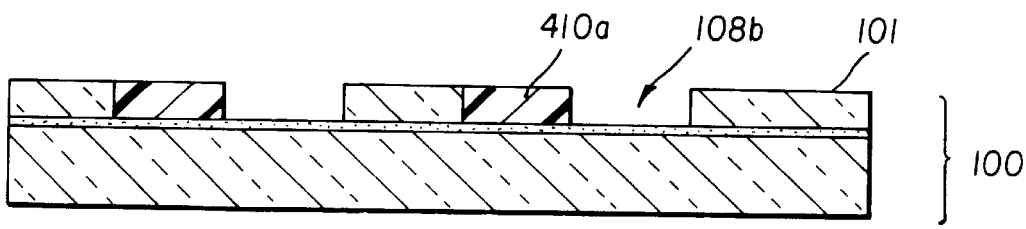
Figure 3K:
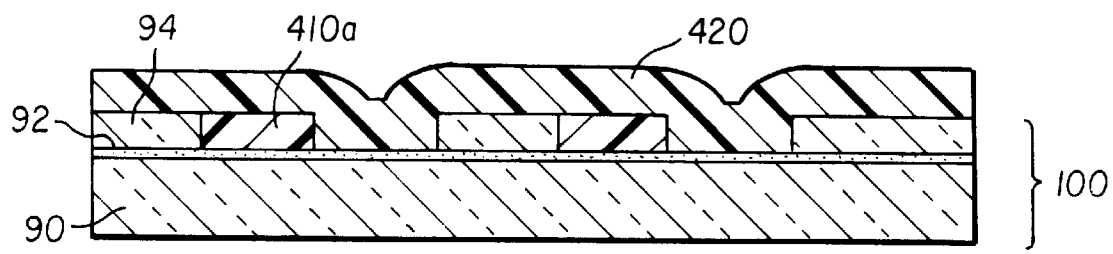
Figure 3L:
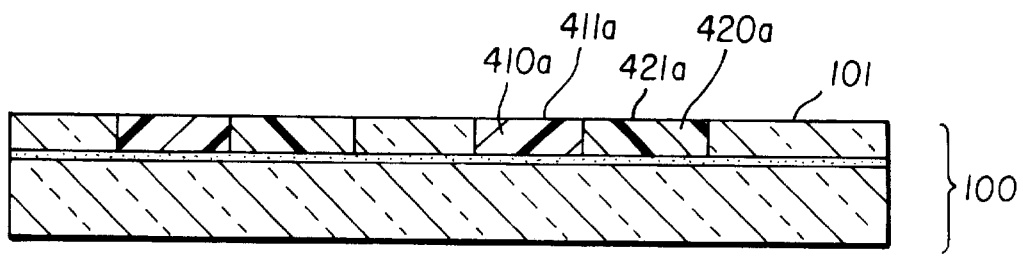
Figure 3M:
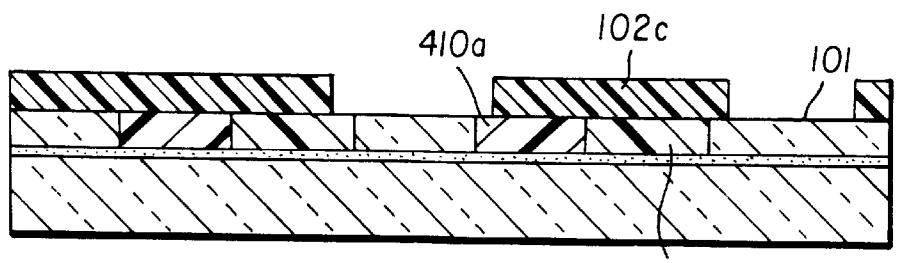
Figure 3N:
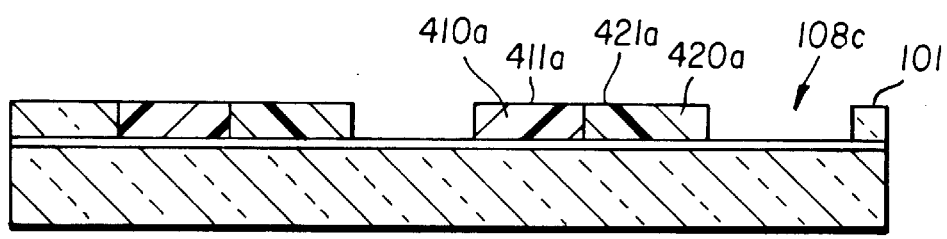
Figure 3O:
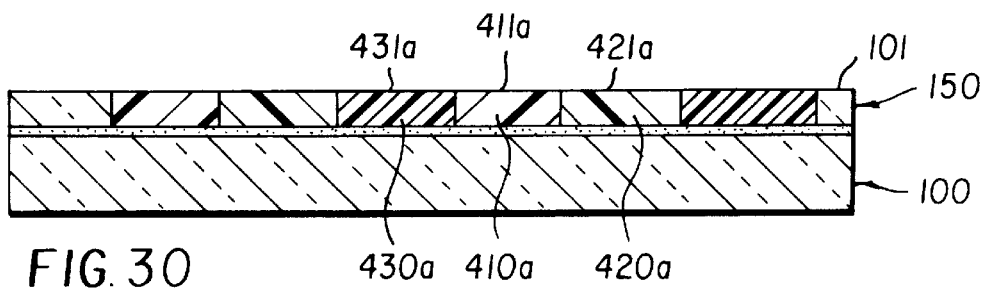

In a preferred embodiment of the present invention, illustrated in FIGS. 3A–3O, a method is provided by which a fully planar color filter array of contiguous color filter elements is embedded in a planarized support layer comprised of transparent dielectric layers, the contiguous color filter elements having no regions of overlap. This method is advantageous in that the resulting color filter elements fully fill the color filter array and are planar and of uniform thickness. A variety of color filter layers may used to provide color filter elements.

Referring to FIG. 3A, semiconductor portion 40, comprising photosensitive regions 14, electrodes 16, and lightshields 18 is shown as representative of the typical elements of the semiconductor portion of a solid state imager. It is desired to provide an embedded, planar color filter array 150 (FIG. 3O) in a support layer 100 (FIG. 3D–3O) overlying semiconductor portion 40 and in registration with photo sensitive regions 14. In accordance with the present invention, this array is made by first providing support layer 100, preferably in the form of a trilayer consisting of a lower transparent dielectric layer 90 (FIG. 3B), an etch stop layer 92 (FIG. 3D), and an upper transparent dielectric layer 94 (FIG. 3D). Lower transparent dielectric layer 90 is preferably an oxide deposited by chemical vapor deposition; etch stop layer 92 is preferably a thin layer of nitride, or polysilicon, diamond-like carbon deposited by plasma enhanced CVD; and upper transparent dielectric layer 94 is preferably an oxide deposited by chemical vapor deposition. Lower transparent dielectric layer 90 is shown deposited in FIG. 3B to a thickness sufficient to cover the topography of semiconductor portion 40, typically in the range of one half to two microns. As shown in FIG. 3C, lower transparent dielectric layer 90 is planarized optically flat, preferably by chemical mechanical polishing, so that light rays directed toward optically planar surface 91 are refracted as expected for an ideal planar dielectric surface. Etch stop layer 92, typically of thickness less than 500 A, is shown uniformly deposited in FIG. 3D. Upper transparent dielectric layer 94, typically of thickness 0.1 to 1.0 micron is also shown in FIG. 3D. The thickness of upper transparent dielectric layer 94 is chosen such that the desired thickness of the color filter elements to be provided is at least equal to the sum of the thicknesses of etch stop layer 92 and upper transparent dielectric layer 94, so that removal of etch stop layer 92 still leaves the height of the color filter elements as deposited greater than the height of surface 101. A feature of the present invention is that etch stop layer 92, upper transparent dielectric layer 94, and surface 101 are optically planar as deposited, because they have been deposited uniformly on optically planar surface 91.

Support layer 100 with surface 101 is shown in FIG. 3E after the steps of patterning conventional photoresist 102a in registration with photosensitive regions 14 in semiconductor portion 40 and after removing, preferably by reactive ion etching, upper transparent dielectric layer 94, the etch topping automatically on etch stop layer 92, to form openings 108a.

Next, as shown in FIG. 3F, it is desired to coat first color filter layer 410 over the structure to a thickness at least sufficient to entirely fill openings 108a. First color filter layer 410 may be spin-coated in the preferred case that it is a dyed polyimide, or it may be deposited by other means, such as evaporation, in the case that the color filter layer is an evaporable layer such as a pigment. First color filter layer 410 is then removed from surface 101 except in openings 108a over the first color filter elements, preferably by chemical mechanical polishing using a slurry of aluminum oxide, thereby forming first embedded color filter elements 410a (FIG. 3G). The surfaces 411a of first color filter elements 410a are shown substantially coplanar with the surface 101 of support layer 100 in FIG. 3G. This may be accomplished by extending the time of polishing beyond that required for the removal of first color filter layer 410 from surface 101 between openings 108a, while still retaining a planar surface 111a, as is well known in the art of chemical mechanical polishing.

Photoresist 102b is then coated (FIG. 3H) and patterned to allow second openings 108b (FIG. 3I) to be formed in support layer 100, the etching procedure being similar to that discussed in regard to the formation of openings 108a. The precise alignment of the edge of photoresist 102b at the left edge of openings 108a is not critical, because the etch used to make opening 108b is preferable chosen to selectively etch upper transparent dielectric layer 94 while not etching first color filter element 410a. Such an etch is preferably a reactive ion etch containing fluorinated hydrocarbons.

As shown in FIG. 3J, photoresist 102b has been removed in preparation for embedding second color filter elements 420a (FIG. 3L) having different spectral transmission characteristics than first color filter elements 410a. The embedding of second color filter elements 420a proceeds in a manner identical to that of first color filter elements 410a, including coating second color filter layer 420 (FIG. 3K) and removing entirely this layer except in openings 108b, preferably by chemical mechanical polishing, to provide second color filter elements 420a (FIG. 3L). Second color filter layer 420 may be spin-coated in the preferred case that it is a dyed polyimide, or may be deposited by other means, such as evaporation, in the case that the color filter layer is an evaporable material such as a pigment. The result of embedding second color filter elements 420a is shown in FIG. 3L. The surfaces 411a and 421a of the first and second color filter elements 410a and 420a are shown embedded in surface support layer 100 and substantially coplanar, typically to within ±100 A, to surface 101, as is well known to be achievable in the art by the use of chemical mechanical polishing.

Next, it is desired to form an embedded third color filter element in a manner similar to that used to provide the first and second color filter elements. The steps follow the discussion previously given for embedding the first and second color filter elements, as shown in FIG. 3I–3L. Photoresist 102c (FIG. 3M) is patterned to provide a mask for etching openings 108c (FIG. 3N) in upper transparent dielectric layer 94 between first and second color filter elements 410a and 420a. The precise alignment of the edges of photoresist 102c is not critical, because the etch used to make openings 108c can be chosen to selectively etch upper transparent dielectric layer 94 while not etching first or second color filter elements 410a and 420a. The use of photoresist 102c may not be required at all if image sensor structures outside the region of the color filter array do not need protection from the etch used to make openings 108c. After removing photoresist 102c, the third color filter layer 430 is coated (not shown) and planarized (FIG. 3O) to form third color filter elements 430a with surfaces 431a, in a manner identical to that used to provide second color filter elements 420a with surfaces 421a. The final structure of the planar color filter array (FIG. 3O) shows a series of adjacent color filter elements 410a, 420a, and 430a, each having different spectral transmission characteristics, and surfaces 411a, 421a, and 431a coplanar with surface 101 of support layer 100 in which are embedded the color filter elements 410a, 420a and 430a which form planar color filter array 150. Both the bottom surfaces and top surfaces of the color filter elements are coplanar with one another, the thickness of all elements being defined by the thickness of upper transparent dielectric layer 94 less any overetch that occurs during chemical mechanical polishing. Color filter elements are provided contiguous on all sides by the method of this invention, with no detectable vertical overlap.

A second preferred embodiment for making an array of color filter elements embedded in a support layer made in accordance with this invention is next described, the object of this method being to provide color filters whose thickness can be more precisely selected and which are encapsulated laterally by an inorganic diffusion barrier to prevent intermixing of dyes during subsequent processing. The second preferred embodiment also illustrates certain processing options available in both embodiments of the current invention.

Figure 4A:
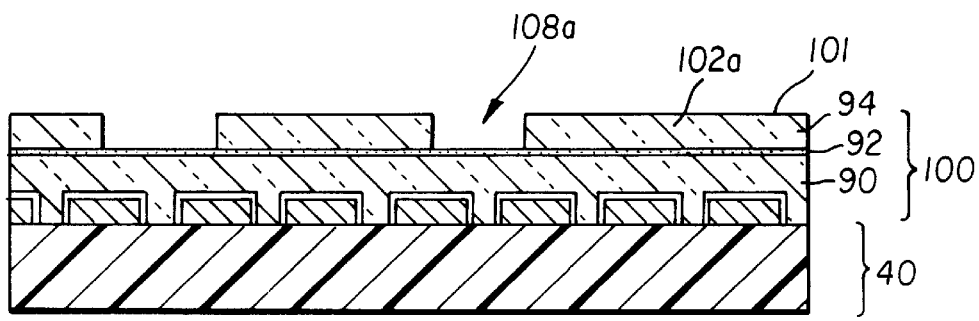
FIGS. 4A–4K show cross-sectional views in various stages of making a second embodiment of an imager pixels in accordance with this invention.

Referring to FIG. 4A, as in the previous embodiment a support layer 100 having a surface 101, which has been optically planarized by chemical mechanical polishing so that light is refracted as expected from an ideal flat dielectric surface, is provided over semiconductor portion 40 of a solid state imager. Support layer 100 may be a single layer of transparent dielectric material such as an oxide deposited by chemical vapor deposition and optically planarized by chemical mechanical polishing, or support layer 100 may comprise a trilayer consisting of a lower transparent dielectric layer, preferably an oxide deposited by chemical vapor deposition and optically planarized, an etch stop layer, preferably a thin layer of nitride or polysilicon deposited by plasma enhanced CVD, and an upper transparent dielectric layer, preferably an oxide deposited by chemical vapor deposition, as was the case for support layer 100 discussed in the previous embodiment. Where like parts correspond, the same numbers are used in the remaining figures.

Figure 4B:
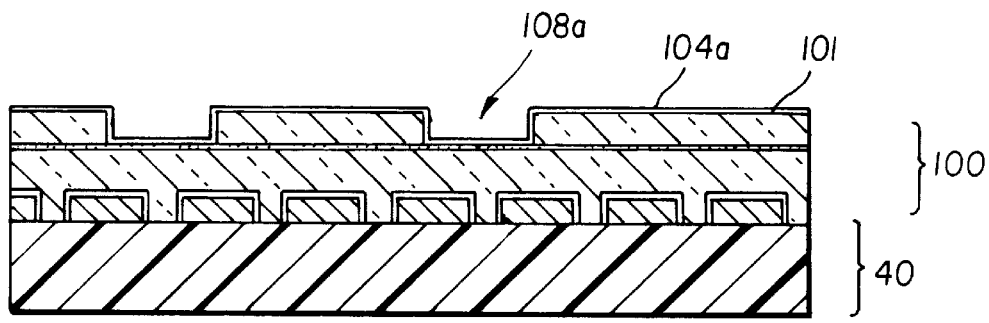

In FIG. 4A, openings 108a are formed by patterning conventional photoresist 102a and etching the upper transparent dielectric layer 94 of substrate layer 100 anisotropically, preferably by reactive ion etching so that the sidewalls of openings 108a are substantially vertical. The etch may proceed to an etch stop layer 92 as in the case of the previous embodiment, or the etch may be timed to achieve a depth dependent on the etch rate but independent of the image sensor structure. The depth of the etch is selected to be equal to the desired thickness of the first color filter element plus the thickness of a first protective layer 104a (FIG. 4B) deposited after completion of the etch and removal of photoresist 102a. The protective layer 104a, preferably a conformally deposited inorganic thin film such as plasma deposited nitride, is shown in FIG. 4B. The preferred range of thickness of protective layer 104a is less than 0.1 micron for the preferred case of an inorganic material. The minimum thickness should be sufficient to act as a diffusion barrier to dyes used in the color filter elements to be formed, typically about 50–100 A.

Figure 4C:
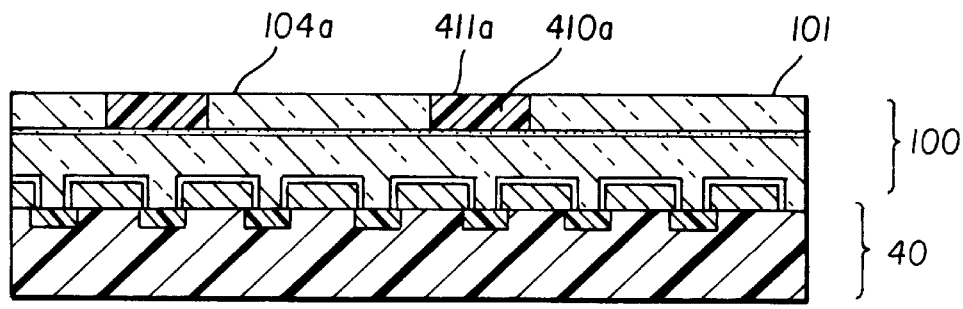

Next, as shown FIG. 4C, first color filter elements 410a are formed in a manner identical to the process of their formation discussed in the previous embodiment, namely by coating a first color filter layer (not shown) and then planarizing the layer to remove it entirely from the image sensor structure except in openings 108a, by chemical mechanical polishing. First color filter layer 410a may be spin-coated in the preferred case that it is a dyed polyimide, or may be deposited by other means, such as evaporation, in the case that the color filter layer is an evaporable material such as a pigment.

Figure 4D:
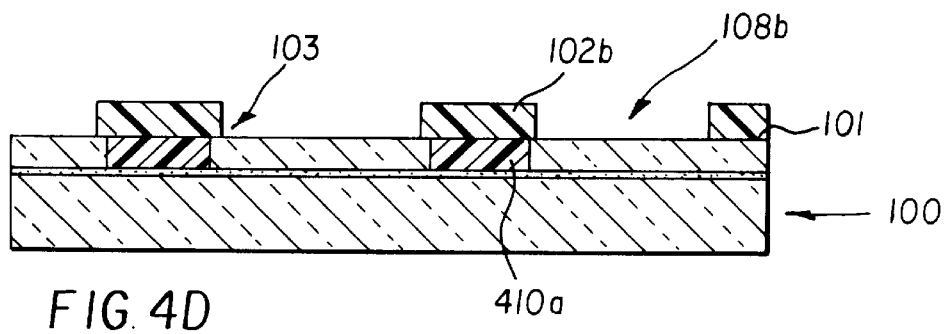
Figure 4E:
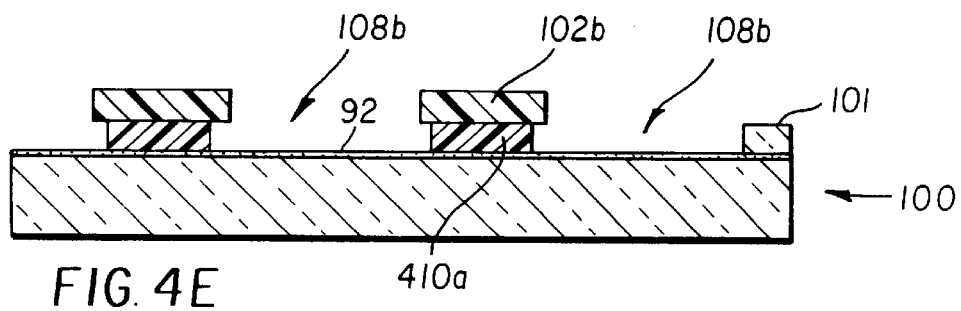

It is then desired to form second openings 108b in substrate layer 100 in which second color filter elements 420a having different spectral transmission characteristics can be imbedded. This is accomplished by providing photoresist 102b (FIG. 4D) over first color filter elements 410a and further etching the substrate layer 100 using an etch which selectively etches substrate layer 100 without etching first protective layer 104a or etch stop 92. Because of the presence of non-etchable protective layer 104a, the precise location of the edge of patterned photoresist layer 102b is not as critical as it would otherwise be, as indicated by the overlap 103 of the patterned photoresist onto the surface 101 in FIG. 4D. Next, in FIG. 4E, openings 108b are formed by plasma etching, the requirement of an anisotropic etch being relaxed by the presence of the non-etchable encapsulation layer 104a. In the case for which the substrate layer 100 itself contains an etch stop layer, the etch is advantageously chosen to be isotropic. If the etch is sufficiently selective against the color filter element materials as well, photoresist 102b is not required and the steps shown in FIGS. 4D and 4E may be omitted.

Figure 4F:
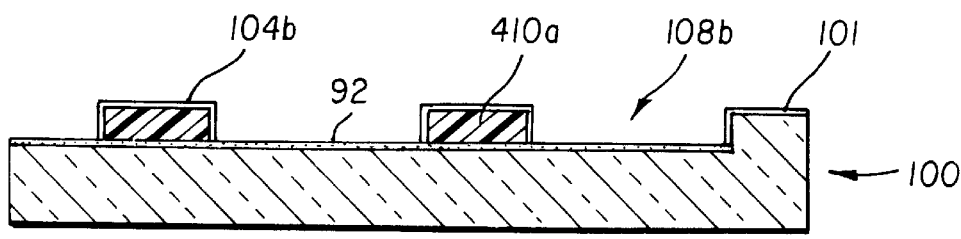

Second color filter element 420a is then formed by in a manner identical to the formation of first color filter element 410a, except that prior to the deposition of second color filter layer 420 (not shown) second encapsulation layer 104b is deposited conformally (FIG. 4F) to a thickness chosen such that the thickness of the second color layer 220 equals the depth of opening 108b less the sum of the thicknesses of first and second encapsulation layers 104a and 104b. This enables independent adjustment of the thickness of color filter element 420a, even in the case when the etch depths of openings 108a and 108b are controlled by the presence of an etch stop layer 92.

Figure 4G:
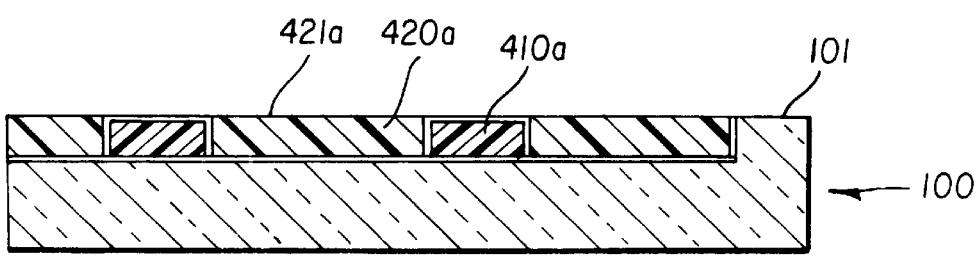

As shown in FIG. 4G, second color filter element 420a with surface 421a is formed in opening 108b by coating second color filter layer 420 (not shown) and then planarizing the layer to remove it from the image sensor structure except in openings 108b by chemical mechanical polishing. Second color filter layer 420 may be spin-coated in the preferred case that it is a dyed polyimide, or may be deposited by other means, such as evaporation in the case that the color filter layer is an evaporable material such as a pigment.

Figure 4H:
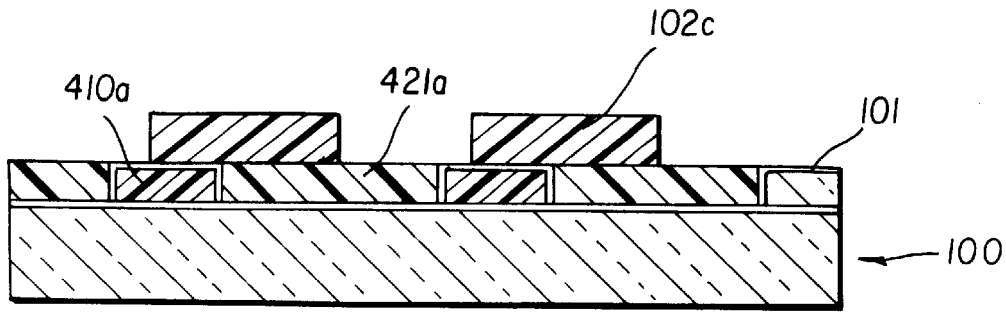
Figure 4I:
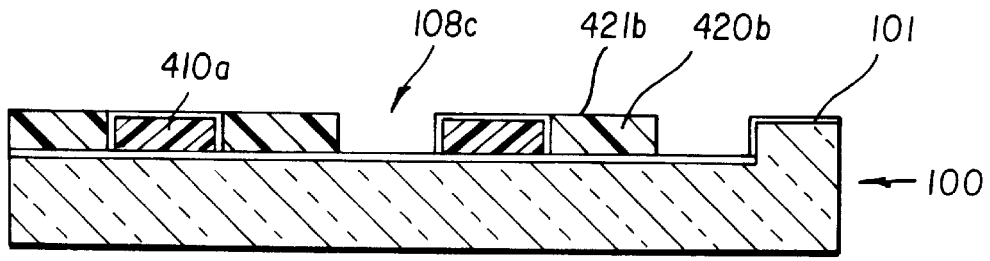

At this stage of fabrication, it is desired to form a third color filter element, which may be provided by first performing the sequence of patterning photoresist 102c (FIG. 4H) and etching openings 108c in second color filter elements 420a (FIG. 4I). Second color filter element 420a is thereby shortened to form modified second color filter element 420b, shown in FIG. 4I. This modification does not occur in the first embodiment described because the opening 108b in that embodiment was chosen to be the exact size of the desired second color filter element, an option that could have been made in the second embodiment as well, the choice in general being best determined by the nature and number of subsequent color filter elements.

Figure 4J:
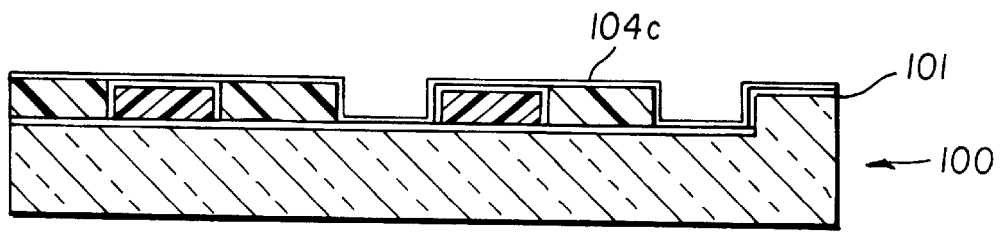
Figure 4K:
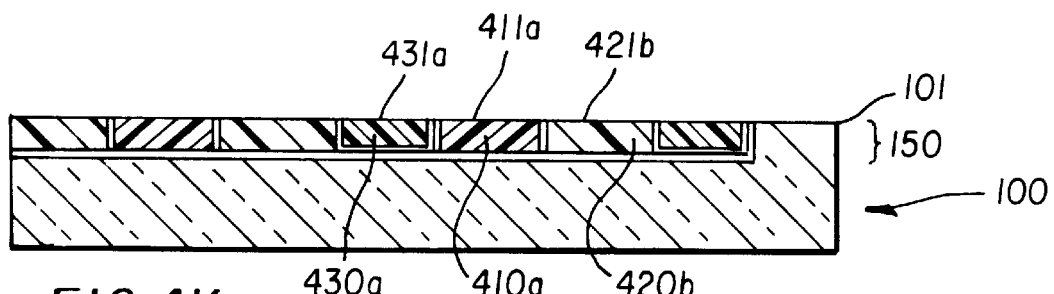

The third color filter element is next provided in a manner identical to the process of forming the first and second color filter elements, namely conformally depositing a third protective layer 104c (FIG. 4J), then depositing a third color filter layer 430 (not shown), and then removing the third color filter layer entirely from the structure except in openings 108c by chemical mechanical polishing. Finally, protective layers 104a, 104b and 104c are removed from the top surface of the structure so formed, preferably by chemical mechanical polishing using a silica based slurry, thereby providing planar color filter array 150 of FIG. 4K whose color filter elements 410a, 420b, and 430a are embedded in support layer 100 with top surfaces 411a, 421b, and 431a coplanar with surface 101.

It is to be appreciated that while this invention has been described in terms of certain preferred embodiments, there are many variations and combinations of these embodiments including variants of materials selected which are obvious to those skilled in the art and which are equally within the scope and spirit of this invention.

In particular, materials other than those described in the preferred embodiments may be used to accomplish like functions as would be obvious to one skilled in the art. For example, in another preferred embodiment, the lower and upper transparent dielectric layer 90 and 94, are preferably a spin on glass such as an oxide glass. In another preferred embodiment, the material used for thin protective films 104a, 104b, and 104c may be chosen from the group oxynitride, tin oxide, indium-tin oxide, amorphous carbon or diamond like carbon. In yet another preferred embodiment, etch stop layer 92 is opaque may be entirely removed from lower transparent dielectric layer 90 by selective etching just prior to coating each color filter layer.

In yet another preferred embodiment, thin protective films 104a, 104b, and 104c may be entirely removed from etch stop layer 92 at the bottom of openings 108a, 108b, and 108c respectively by anisotropic etching just prior to coating each the color filter layer. In this case, the materials used for thin protective films 104a, 104b, and 104c may be opaque in order to limit light scatter between adjacent color filter elements, preferably chosen from the group tungsten, tungsten silicide, aluminum, titanium, titanium nitride, or other refractory metals.

In yet another preferred embodiment, the structure in FIG. 4G is left unaltered, thereby providing a color filter array consisting of color filter elements of only two distinct spectral transmission characteristics, a structure known to the art to be useful in providing one of two color filter arrays for subtractive color filter systems.

The invention has been described in detail with particular reference to certain preferred embodiments thereof, but it will be understood that variations and modifications can be effected within the spirit and scope of the invention.

PARTS LIST 10 pixel
12 semiconductor substrate
14 photosensitive regions
16 electrode
18 light shield
20a partially planarizing layer
20b upper planarizing layer
22 lens
24a color filter element
24b color filter element
40 semiconductor portion
60 region
62 region
90 lower transparent dielectric layer
91 optically planar surface
92 etch stop layer
94 upper transparent dielectric layer
100 support layer
101 surface
102a photoresist
102b photoresist
102c photoresist
104a first protective layer
104b second protective layer
104c third protective layer
108a opening
108b opening
108c opening
150 planar color filter array
410 first color filter layer
410a first color filter element
411a surface
420 second color filter layer
420a second color filter element
420b modified second color filter element
421b surface
430 third color filter layer
430a third color filter element
431a surface

We claim:

1. An image sensor which includes an integral color filter array, comprising:

(a) a semiconductor substrate, and a first dielectric layer disposed over the substrate and having an optically planar surface formed by chemical mechanical polishing and a second dielectric layer disposed over the first dielectric layer and having an optically planar top surface;

(b) a plurality of spaced image pixels formed in the substrate; and (c) an array of physically contiguous color filter elements embedded in the second dielectric layer whose top and bottom surfaces are coplanar and which have no overlap of color filter layers between adjacent color filter elements.

2. An image sensor which includes an integral color filter array, comprising:

(a) a semiconductor substrate, and a first dielectric layer disposed over the substrate and having an optically planar surface formed by chemical mechanical polishing and a second dielectric layer disposed over the first dielectric layer and having an optically planar top surface;

(b) a plurality of spaced image pixels formed in the substrate; and (c) an array of contiguous color filter elements embedded in the second dielectric layer whose top and bottom surfaces are coplanar, such array including an inorganic dye diffusion barrier separating adjacent color filter elements with no two color filter layers overlapping.

* * * * *